(12) United States Patent
Kazuno et al.

(10) Patent No.: US 11,776,860 B2
(45) Date of Patent: Oct. 3, 2023

(54) METHOD OF MANUFACTURING ELECTRONIC DEVICES WITH A CAP AND MOLDING

(71) Applicant: SEIKO EPSON CORPORATION, Tokyo (JP)

(72) Inventors: Masataka Kazuno, Kofu (JP); Tetsuya Otsuki, Fujimi-machi (JP); Hitoshi Ueno, Shiojiri (JP)

(73) Assignee: SEIKO EPSON CORPORATION, Tokyo (JP)

(*) Notice: Subject to any disclaimer, the term of this patent is extended or adjusted under 35 U.S.C. 154(b) by 225 days.

(21) Appl. No.: 17/471,577

(22) Filed: Sep. 10, 2021

(65) Prior Publication Data

US 2022/0084898 A1 Mar. 17, 2022

(30) Foreign Application Priority Data

Sep. 11, 2020 (JP) .................... 2020-152563

(51) Int. Cl.
| | |
|---|---|
| *H01L 23/043* | (2006.01) |
| *G01C 19/5783* | (2012.01) |
| *H01L 23/31* | (2006.01) |
| *H01L 23/498* | (2006.01) |
| *H01L 23/00* | (2006.01) |
| *H01L 23/495* | (2006.01) |

(52) U.S. Cl.
CPC ........ *H01L 23/043* (2013.01); *G01C 19/5783* (2013.01); *H01L 23/3178* (2013.01); *H01L 23/49541* (2013.01); *H01L 23/49861* (2013.01); *H01L 24/48* (2013.01); *H01L 2224/48091* (2013.01)

(58) Field of Classification Search
CPC ...................................................... H01L 23/043
USPC .......................................... 438/123; 257/666
See application file for complete search history.

(56) References Cited

U.S. PATENT DOCUMENTS

| | | | |
|---|---|---|---|
| 2009/0129028 A1* | 5/2009 | Son .................. | H01L 23/49575 257/723 |
| 2009/0268423 A1* | 10/2009 | Sakurai ................ | H05K 1/144 361/803 |
| 2011/0219873 A1 | 9/2011 | Ohta et al. | |
| 2022/0085004 A1* | 3/2022 | Kazuno .................... | G01P 1/02 |
| 2022/0087023 A1* | 3/2022 | Kazuno .................. | H05K 1/181 |

FOREIGN PATENT DOCUMENTS

| | | |
|---|---|---|
| JP | 2007-214186 | 8/2007 |
| JP | 2011-191079 | 9/2011 |
| JP | 2013-183069 | 9/2013 |

* cited by examiner

*Primary Examiner* — Ajay Arora
(74) *Attorney, Agent, or Firm* — Rankin, Hill & Clark LLP

(57) ABSTRACT

A method of manufacturing an electronic device includes a preparation step of preparing a substrate to which a lead is bonded, and a molding step of mounting a cap in a mold in a state in which the cap is disposed on the substrate and forming a mold portion by filling a mold material into the mold. The mold includes a first mold including a cap mounting portion, and a second mold including a lead pressing portion. The molding step includes a step of mounting the cap in the cap mounting portion, a step of mounting the substrate on the cap, a step of pressing the lead with the lead pressing portion to elastically deform the lead, and biasing the substrate toward the cap by a restoring force generated in the lead, and a step of filling the mold material into the mold.

12 Claims, 11 Drawing Sheets

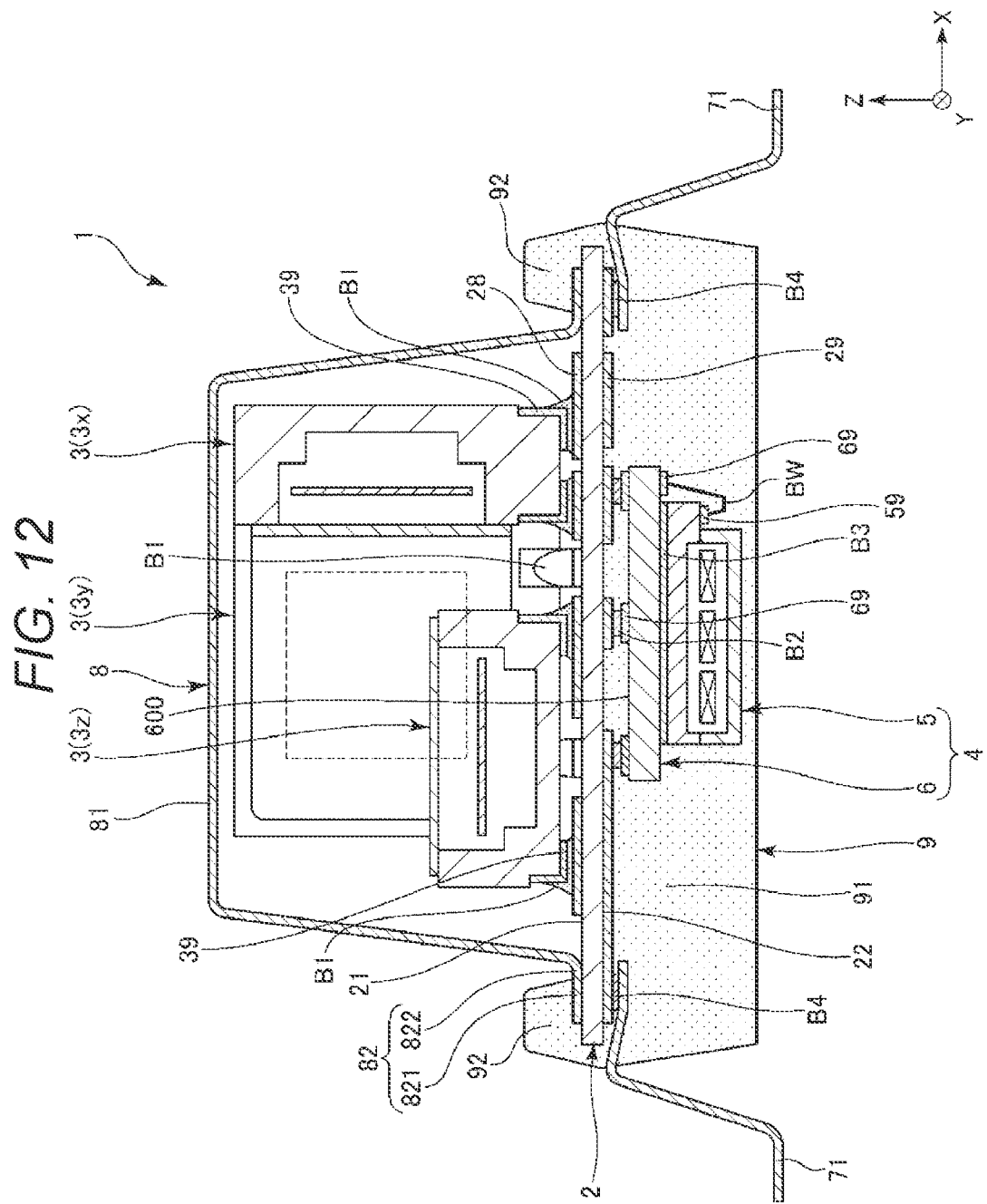

METHOD OF MANUFACTURING ELECTRONIC DEVICES WITH A CAP AND MOLDING

The present application is based on, and claims priority from JP Application Serial Number 2020-152563, filed Sep. 11, 2020, the disclosure of which is hereby incorporated by reference herein in its entirety.

BACKGROUND

1. Technical Field

The present disclosure relates to a method of manufacturing an electronic device.

2. Related Art

An angular velocity detection device disclosed in JP-A-2011-191079 includes a metal core substrate, a semiconductor element mounted on the metal core substrate for detecting an angular velocity, a cap bonded to the metal core substrate via an adhesive so as to accommodate the semiconductor element, and a mold portion molding the metal core substrate and the cap.

However, in the above configuration, since the metal core substrate and the cap are bonded to each other with the adhesive, a manufacturing cost of the angular velocity detection device may increase due to use of the adhesive.

SUMMARY

A method of manufacturing an electronic device according to the present disclosure is provided. The electronic device includes: a substrate having a first surface and a second surface that are in a front and back relationship with each other; a first electronic component mounted on the first surface of the substrate; a lead bonded to the substrate; a cap disposed on the first surface and accommodating the first electronic component between the cap and the substrate; and a mold portion molding a bonding portion between the lead and the substrate and bonding the cap and the substrate. The method of manufacturing the electronic device includes: a preparation step of preparing the substrate on which the first electronic component is mounted and to which the lead is bonded; and a molding step of mounting the cap in a mold in a state in which the cap is disposed on the substrate, and forming the mold portion by filling a mold material into the mold, in which the mold includes a first mold including a cap mounting portion in which the cap is mounted, and a second mold including a lead pressing portion configured to press the lead to elastically deform the lead, and the molding step includes mounting the cap in the cap mounting portion, mounting the substrate on the cap, pressing the lead by the lead pressing portion to elastically deform the lead, and biasing the substrate toward the cap side by a restoring force generated in the lead, and filling the mold material into the mold.

BRIEF DESCRIPTION OF THE DRAWINGS

FIG. 12 is a cross-sectional view showing an electronic device according to a third embodiment.

DESCRIPTION OF EXEMPLARY EMBODIMENTS

Hereinafter, an electronic device according to an aspect of the present disclosure will be described in detail based on an embodiment shown in the accompanying drawings. For convenience of illustration, three axes orthogonal to one another are shown as an X axis, a Y axis, and a Z axis in each of the drawings except for FIG. 4. A direction parallel to the X axis is also referred to as an "X axis direction". A direction parallel to the Y axis is also referred to as a "Y axis direction". A direction parallel to the Z axis is also referred to as a "Z axis direction". A tip end side of an arrow indicating each axis is also referred to as a "positive side". An opposite side thereof is also referred to as a "negative side". The positive side in the Z axis direction is also referred to as "upper". The negative side in the Z axis direction is also referred to as "lower".

First Embodiment

Figure 1:
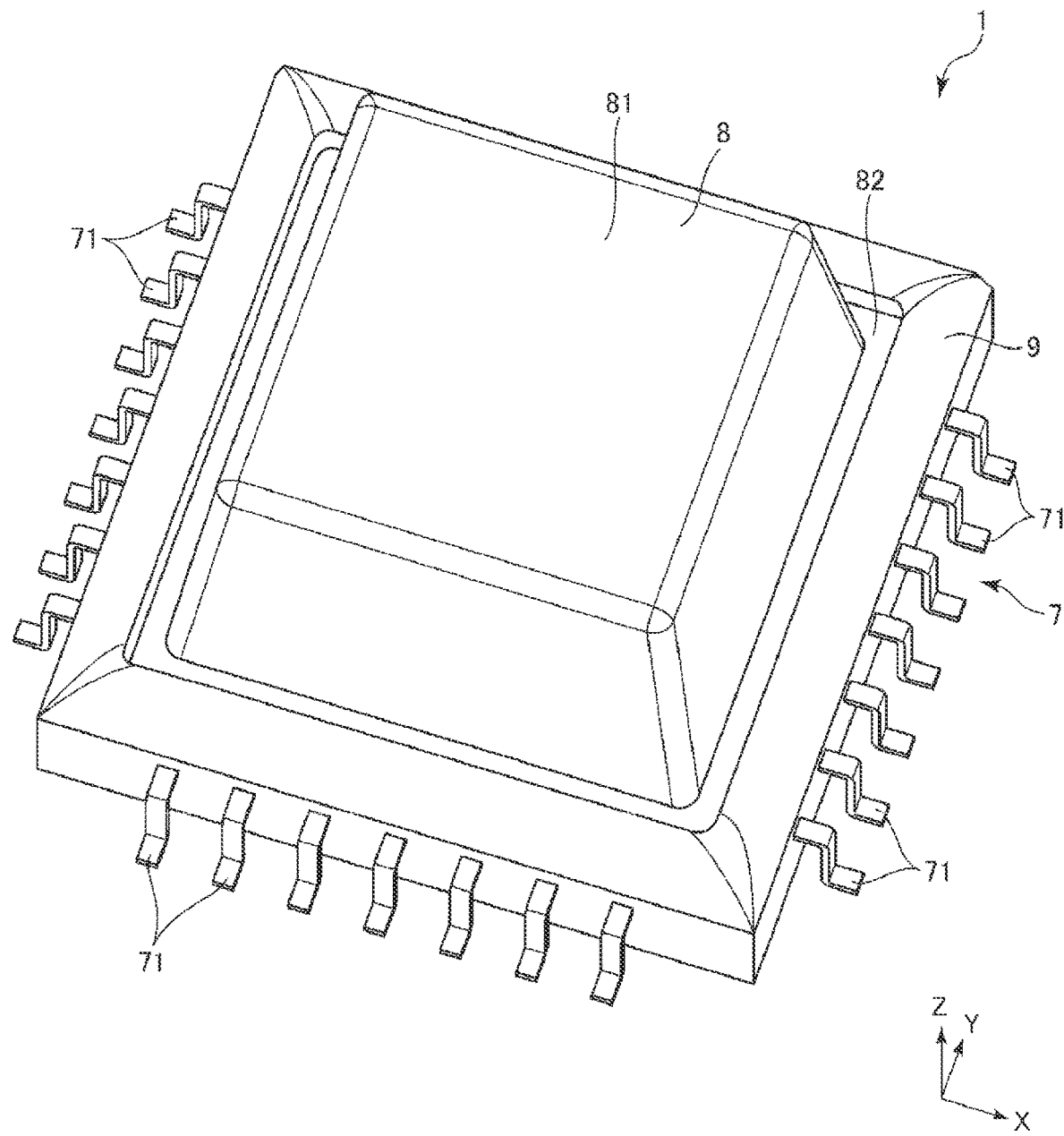
FIG. 1 is a perspective view showing an electronic device according to a first embodiment.
Figure 2:
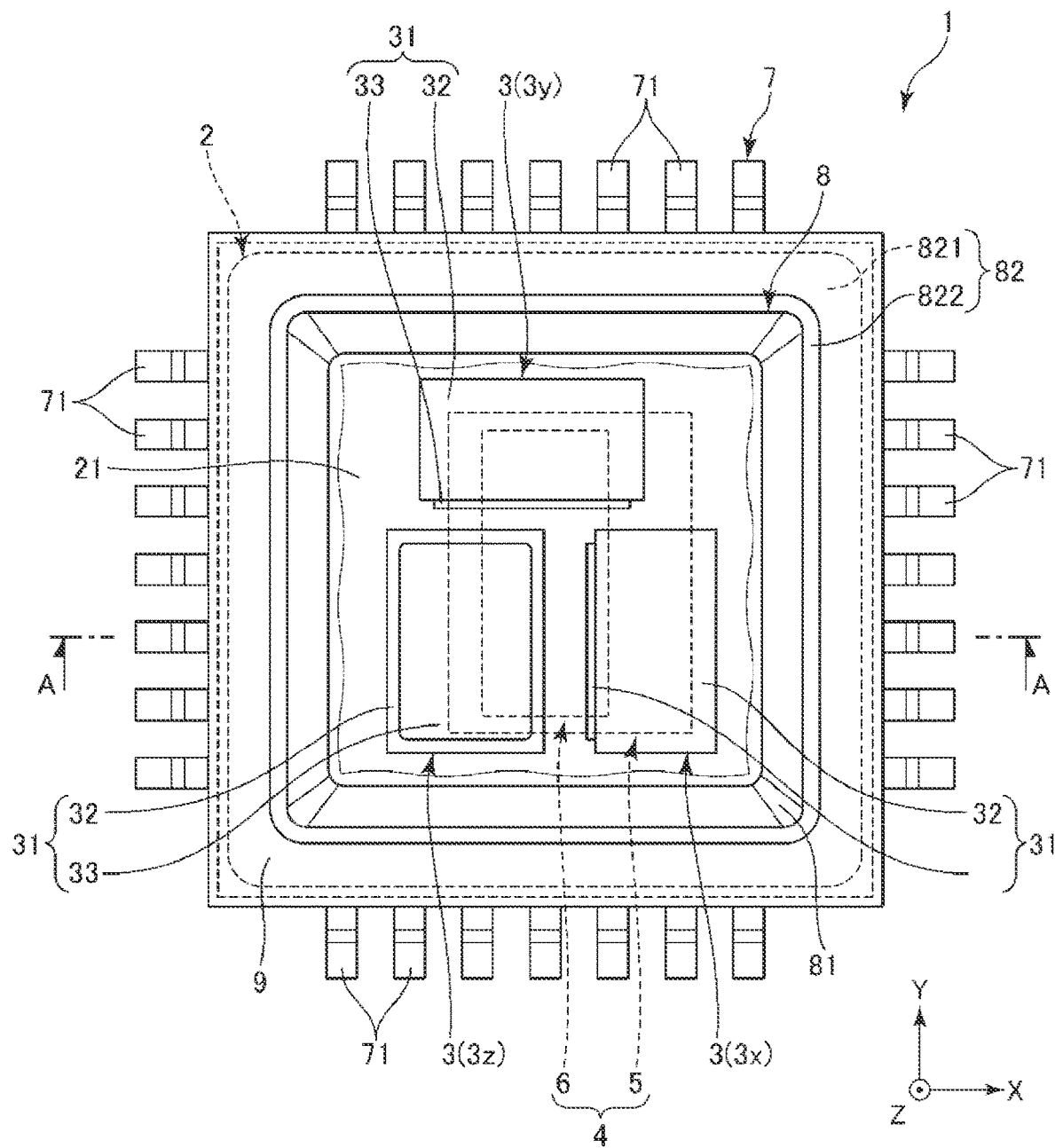
FIG. 2 is a plan view showing inside of a cap of the electronic device shown in FIG. 1.
Figure 3:
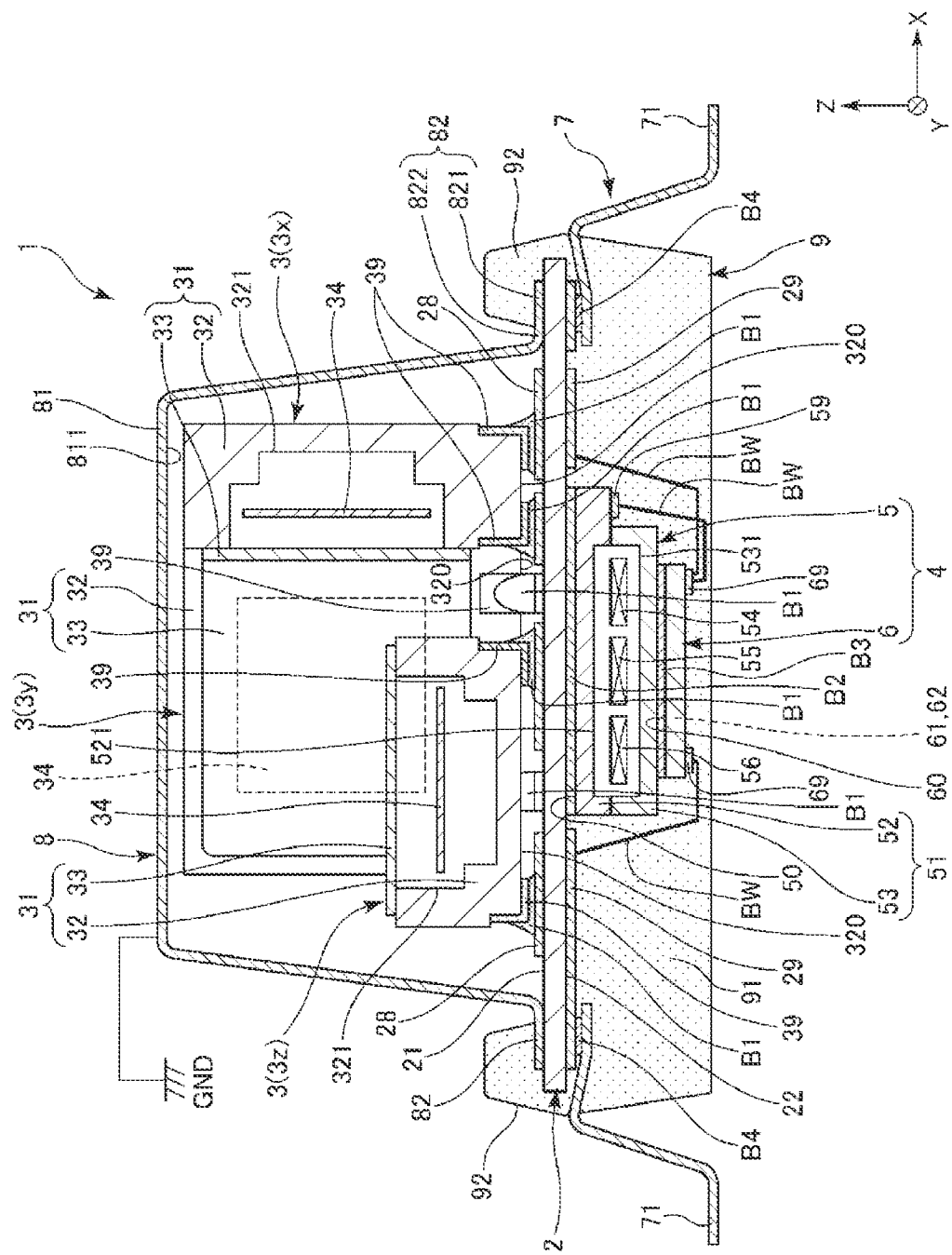
FIG. 3 is a cross-sectional view taken along a line A-A in FIG. 2.
Figure 4:
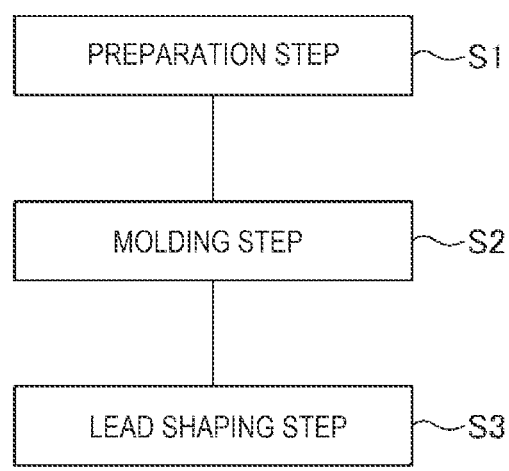
FIG. 4 is a flowchart showing manufacturing steps of the electronic device shown in FIG. 1.
Figure 5:
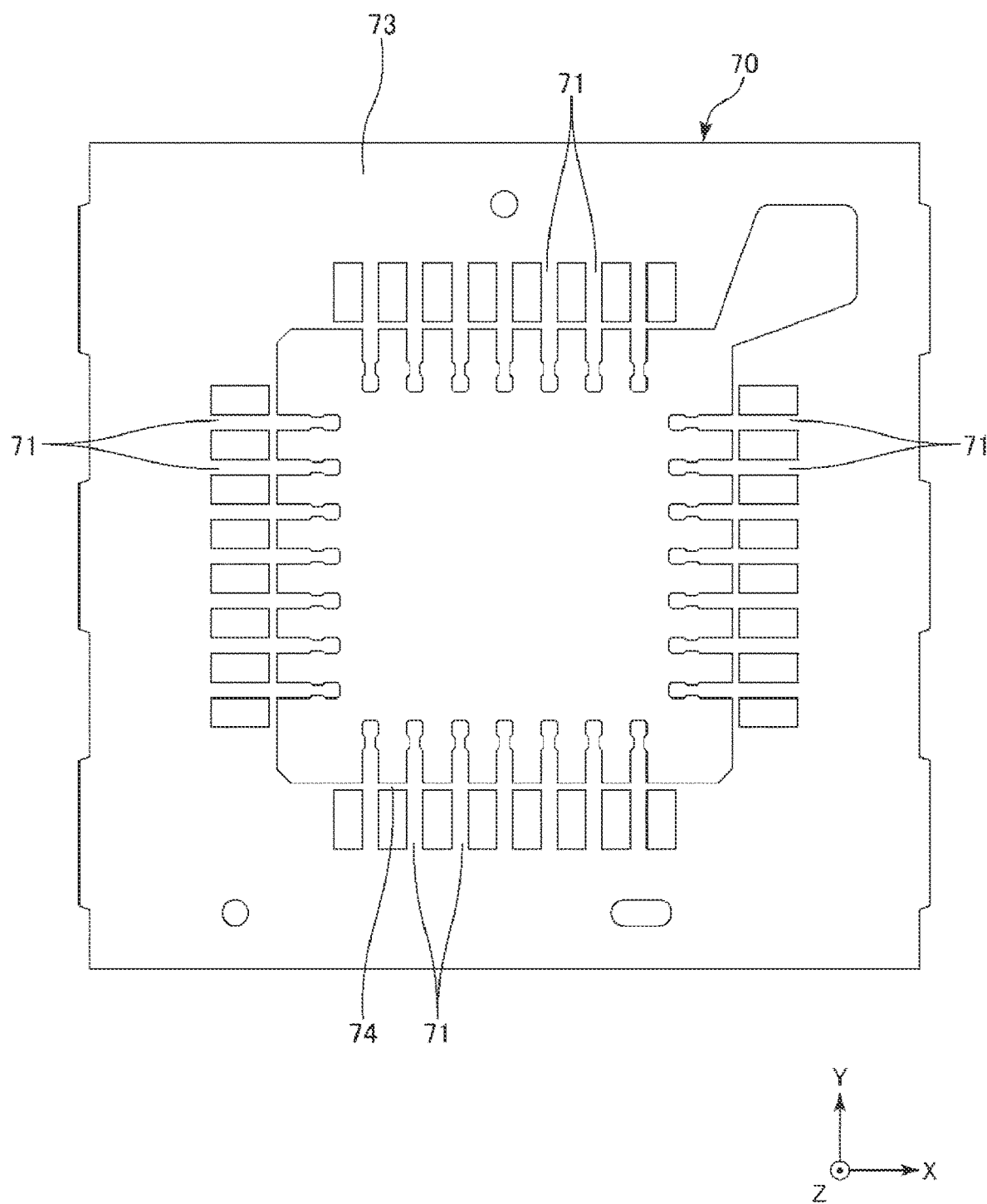
FIG. 5 is a plan view showing a lead frame.

FIG. 1 is a perspective view showing an electronic device according to a first embodiment. FIG. 2 is a plan view showing inside of a cap of the electronic device shown in FIG. 1. FIG. 3 is a cross-sectional view taken along a line A-A in FIG. 2. FIG. 4 is a flowchart showing manufacturing steps of the electronic device shown in FIG. 1. FIG. 5 is a plan view showing a lead frame. FIGS. 6 to 10 are cross-sectional views for illustrating a method of manufacturing the electronic device. In FIG. 2, a first wiring pattern is not shown for convenience of illustration.

An electronic device 1 shown in FIG. 1 has a quad flat package (QFP) structure. As shown in FIGS. 2 and 3, the electronic device 1 includes a substrate 2, a first electronic component 3 located on an upper surface 21 side of the substrate 2 and bonded to the upper surface 21, a second electronic component 4 located on a lower surface 22 side of the substrate 2 and bonded to the lower surface 22, a lead group 7 including a plurality of leads 71 bonded to the lower surface 22 of the substrate 2, a cap 8 covering the substrate 2 so as to cover the first electronic component 3, and a mold portion 9 that molds and seals the second electronic component 4 and bonds the cap 8 to the substrate 2. The electronic device 1 includes three angular velocity sensors 3x, 3y, and 3z as the first electronic component 3, and includes an acceleration sensor 5 and a circuit element 6 as the second electronic component 4.

The substrate 2 has a substantially square plate shape in a plan view, and has the upper surface 21 as a first surface and the lower surface 22 as a second surface which are in a front and back relationship with each other. The substrate is a ceramic substrate and is made of various ceramic materials such as alumina and titania. When the ceramic substrate is used as the substrate 2, the substrate 2 has high corrosion resistance. The substrate 2 having excellent mechanical strength is obtained. Since moisture absorption is less likely to occur and heat resistance is excellent, damage due to heat applied at the time of manufacturing the electronic device 1 is less likely to occur. By using the same material as that of a base 32 included in the angular velocity sensors 3x, 3y, and 3z, thermal stress due to a linear expansion coefficient difference is less likely to occur therebetween. Therefore, the electronic device 1 having excellent long-term reliability is obtained. The substrate 2 is not limited to a ceramic substrate. For example, various semiconductor substrates, various glass substrates, and various printed substrates can also be used.

A first wiring pattern 28 electrically coupled to the first electronic component 3 is disposed on the upper surface 21 of the substrate 2. On the other hand, a second wiring pattern 29 electrically coupled to the second electronic component 4 is disposed on the lower surface 22 of the substrate 2. The first wiring pattern 28 is electrically coupled to the second wiring pattern 29 via a through electrode, which is not shown, formed in the substrate 2.

The first electronic component 3 is a packaged surface mount component. Accordingly, it is possible to exhibit higher mechanical strength than a mount component in which an element is exposed. The first electronic component 3 can be easily mounted on the substrate 2. The first electronic component 3 is a physical quantity sensor. In particular, in the present embodiment, three angular velocity sensors 3x, 3y, and 3z are provided. The angular velocity sensor 3x is a sensor that detects an angular velocity around the X axis. The angular velocity sensor 3y is a sensor that detects an angular velocity around the Y axis. The angular velocity sensor 3z is a sensor that detects an angular velocity around the Z axis. By using the first electronic component 3 as the physical quantity sensor, the electronic device 1 that is suitably mounted on various electronic devices and mobile bodies is obtained. Therefore, convenience and demand of the electronic device 1 are increased. In particular, since the electronic device 1 can detect the angular velocities about three axes orthogonal to one another, the above effect is more remarkable.

Basic configurations of the angular velocity sensors 3x, 3y, and 3z are the same as one another. The angular velocity sensors 3x, 3y, and 3z are mounted in different postures so that detection axes face the X-axis direction, the Y-axis direction, and the Z-axis direction. As shown in FIG. 3, each of the angular velocity sensors 3x, 3y, and 3z includes a package 31 and a physical quantity detection element 34 accommodated in the package 31. The package 31 includes a box-shaped base 32 having a recess 321, and a lid 33 bonded to the base 32 so as to close an opening of the recess 321. The base 32 is constituted by a ceramic material such as alumina. The lid 33 is constituted by a metal material such as Kovar.

As shown in FIG. 3, a plurality of first mounting terminals 39 electrically coupled to the physical quantity detection element 34 are disposed on a lower surface 320. The physical quantity detection element 34 is, for example, a crystal vibration element having a drive arm and a detection arm. In such a crystal vibration element, when the angular velocity around the detection axis is applied in a state where a drive signal is applied to drive and vibrate the drive arm, detection vibration is excited in the detection arm by Coriolis force. Electric charge generated in the detection arm by the detection vibration is extracted as a detection signal. The angular velocity can be obtained based on the extracted detection signal.

Each of the angular velocity sensors 3x, 3y, and 3z is bonded to the upper surface 21 of the substrate 2 at the lower surface 320 via a conductive first bonding member B1. The first mounting terminal 39 of each of the angular velocity sensors 3x, 3y, and 3z is electrically coupled to the first wiring pattern 28 via the first bonding member B1. The first bonding member B1 is solder, and mechanically and electrically couples the angular velocity sensors 3x, 3y, and 3z to the substrate 2 by solder reflow. Accordingly, it is possible to easily and accurately couple the angular velocity sensors 3x, 3y, and 3z to the substrate 2. The first bonding member B1 is less deteriorated over time and has high reliability. The first bonding member B1 is not limited to solder. For example, various brazing materials such as gold brazing filler and silver brazing filler, various metal bumps such as gold bumps and silver bumps, and various conductive adhesives in which a conductive filler is dispersed in a resin-based adhesive can be used.

Although the angular velocity sensors 3x, 3y, and 3z are described above, the configurations of the angular velocity sensors 3x, 3y, and 3z are not particularly limited. For example, the physical quantity detection element 34 may be formed of a capacitive silicon vibration element, and detect the angular velocity based on a change in capacitance. At least one of the angular velocity sensors 3x, 3y, and 3z may be different from the other angular velocity sensors. In the first electronic component 3, at least one of the angular velocity sensors 3x, 3y, and 3z may be omitted. The first electronic component 3 may be a physical quantity sensor that detects a physical quantity other than the angular velocity, or may not be a physical quantity sensor. The first electronic component 3 does not have to be a packaged surface mount component. For example, the package 31 may be omitted and the physical quantity detecting element 34 may be exposed in the cap 8.

As shown in FIG. 3, the cap 8 is bonded to the substrate 2, and accommodates the angular velocity sensors 3x, 3y, and 3z between the cap 8 and the substrate 2. The cap 8 has a hat shape, and includes a base portion 81 having a recess 811 that opens to the upper surface 21 side, and an annular flange portion 82 protruding from a lower end portion of the base portion 81 toward an outer peripheral side. The cap 8 is disposed on the upper surface 21 of the substrate 2 so as to accommodate the angular velocity sensors 3x, 3y, and 3z in the recess 811. The flange portion 82 comes into contact with the upper surface 21. Then, the cap 8 and the substrate 2 are bonded to each other by the mold portion 9, and the inside of the recess 811 is hermetically sealed.

In this way, by providing the cap 8 that accommodates the angular velocity sensors 3x, 3y, and 3z, the angular velocity sensors 3x, 3y, and 3z can be protected from moisture, dust, impact, and the like. In the present embodiment, the inside of the recess 811 is air-sealed. The present disclosure is not limited thereto. For example, sealing under reduced pressure or sealing under positive pressure may be performed, or the gas may be replaced with a stable gas such as nitrogen or argon.

The cap 8 has conductivity and is formed of, for example, a metal material. In particular, in the present embodiment, the cap 8 is formed of a 42 alloy which is an iron-nickel alloy. Accordingly, the linear expansion coefficient difference between the substrate 2 formed of the ceramic substrate and the cap 8 can be made sufficiently small. Generation of thermal stress due to the linear expansion coefficient difference can be effectively prevented. Therefore, the electronic device 1 is hardly affected by an environmental temperature and has stable characteristics. The cap 8 is coupled to a ground (GND) when the electronic device 1 is used. Accordingly, the cap 8 functions as a shield that blocks electromagnetic noise from the outside. Driving of the angular velocity sensors 3x, 3y, and 3z accommodated in the cap 8 is stabilized. A constituent material of the cap 8 is not limited to the 42 alloy. For example, a metal material such as a SUS material, various ceramic materials, various resin materials, a semiconductor material such as silicon, and various glass materials can also be used.

Here, as a method of bonding the cap 8 and the substrate 2, there is a method of using an adhesive disposed between the flange portion 82 and the substrate 2, particularly an adhesive containing an organic component such as a resin-based adhesive. However, in the present embodiment, such a method is not adopted, and the cap 8 and the substrate 2 are bonded by the mold portion 9. Accordingly, it is possible to reduce a height of the electronic device 1 as compared with the method in which the adhesive is disposed between the flange portion 82 and the substrate 2. There is no risk that the inside of the cap 8 may be contaminated by outgas containing the organic component generated from the adhesive. It is also possible to prevent a decrease in the reliability due to aged deterioration of the adhesive. Therefore, the electronic device 1 is small and has high reliability. Further, since no adhesive is used, the manufacturing cost of the electronic device 1 can be reduced.

In the electronic device 1, the recess 811 is a gap and is not filled with the mold portion 9. That is, the angular velocity sensors 3x, 3y, and 3z accommodated in the cap 8 are not covered with the mold portion 9.

As shown in FIGS. 2 and 3, the second electronic component 4 includes the acceleration sensor 5 and the circuit element 6. Since the electronic device 1 includes the circuit element 6, the angular velocity sensors 3x, 3y, and 3z and the acceleration sensor 5 can be coupled to the circuit element 6 in the electronic device 1. Therefore, a wiring length for coupling the components can be shortened. Therefore, in particular, noise is less likely to be added to detection signals output from the angular velocity sensors 3x, 3y, and 3z and the acceleration sensor 5, and the angular velocity around each axis and the acceleration in each axis direction can be more accurately detected.

As shown in FIG. 3, an upper surface 50 of the acceleration sensor 5 is bonded to the lower surface 22 of the substrate 2 via a second bonding member B2. An upper surface 60 of the circuit element 6 is bonded to the lower surface of the acceleration sensor 5 via a third bonding member B3. In the present embodiment, since a shape of the acceleration sensor 5 in the plan view is larger than a shape of the circuit element 6 in the plan view, the acceleration sensor 5 is bonded to the substrate 2, and the circuit element 6 is bonded to the acceleration sensor 5. Accordingly, the acceleration sensor 5 and the circuit element 6 can be disposed on the substrate 2 in a well-balanced manner.

Here, the second bonding member B2 and the third bonding member B3 are not electrically coupled. Therefore, as the second bonding member B2 and the third bonding member B3, for example, various die attach agents, various die attach films, and the like can be used regardless of whether the second bonding member B2 and the third bonding member B3 are conductive or not.

The acceleration sensor 5 is a three-axis acceleration sensor capable of independently detecting an acceleration in the X axis direction, an acceleration in the Y axis direction, and an acceleration in the Z axis direction. That is, the electronic device 1 is a six-axis composite sensor capable of detecting the angular velocity around each axis of the X axis, the Y axis, and the Z axis and the acceleration in each axis direction. In this way, by making the electronic device 1 usable as the physical quantity sensor, the electronic device 1 can be mounted on various electronic components and has high convenience and demand.

The acceleration sensor 5 includes a package 51 and sensor elements 54, 55, and 56 accommodated in the package 51. The package 51 includes a base 52 having a recess 521 formed so as to overlap the sensor elements 54, 55, and 56, and a lid 53 having a recess 531 that opens to a base 52 side and bonded to the base 52 so as to accommodate the sensor elements 54, 55, and 56 in the recess 531. A part of a lower surface of the base 52 is exposed from the lid 53. A plurality of mounting terminals 59 electrically coupled to the sensor elements 54, 55, and 56 are disposed in the exposed part.

The sensor element 54 is an element that detects the acceleration in the X axis direction. The sensor element 55 is an element that detects the acceleration in the Y axis direction. The sensor element 56 is an element that detects the acceleration in the Z axis direction. Each of the sensor elements 54, 55, and 56 is a silicon vibration element including a fixed electrode fixed to the base 52 and a movable electrode variable with respect to the base 52. When the acceleration in the detection axis direction is received, the movable electrode is displaced with respect to the fixed electrode, and the capacitance formed between the fixed electrode and the movable electrode changes. Therefore, a change in the capacitance of each of the sensor elements 54, 55, and 56 is extracted as the detection signal. The acceleration in each axis direction can be obtained based on the extracted detection signal.

Although the acceleration sensor 5 is described above, the configuration of the acceleration sensor 5 is not particularly limited as long as the acceleration sensor 5 can exhibit its function. For example, the sensor elements 54, 55, and 56 are not limited to the silicon vibration elements, and may be, for example, crystal vibration elements, and may be constituted to detect the acceleration based on the electric charge generated by vibration.

The circuit element 6 is an unpackaged semiconductor chip, that is, a bare chip. Accordingly, it is possible to reduce size and cost of the circuit element 6. The circuit element 6 is not limited to the bare chip, and may be a packaged element. The circuit element 6 includes a control circuit 61 that controls driving of the angular velocity sensors 3x, 3y, and 3z and the acceleration sensor 5, and an interface circuit 62 that performs communication with the outside. The control circuit 61 independently controls the driving of the angular velocity sensors 3x, 3y, and 3z and the acceleration sensor 5, and independently detects the angular velocity around each axis of the X axis, the Y axis, and the Z axis and the acceleration in each axis direction based on the detection signals output from the angular velocity sensors 3x, 3y, and 3z and the acceleration sensor 5. The interface circuit 62 transmits and receives signals, receives a command from an external device, and outputs the detected angular velocity and acceleration to the external device. A communication method of the interface circuit 62 is not particularly limited. In the present embodiment, serial peripheral interface (SPI) communication is used. The SPI communication is a communication method suitable for coupling a plurality of sensors. Since all signals related to the angular velocity and the acceleration can be output from one lead 71, pin saving of the electronic device 1 can be achieved.

The circuit element 6 includes a plurality of second mounting terminals 69 disposed on a lower surface thereof. The circuit element 6 is electrically coupled to the acceleration sensor 5 and the second wiring pattern 29 via a bonding wire BW. Accordingly, the circuit element 6 is electrically coupled to the angular velocity sensors 3x, 3y, and 3z, the acceleration sensor 5, and the lead 71.

The lead group 7 is located on the lower surface 22 side of the substrate 2, and includes a plurality of leads 71 bonded to the substrate 2 via a conductive fourth bonding member B4. The plurality of leads 71 are provided substantially uniformly along the four sides of the substrate 2. At least a part of the plurality of leads 71 is electrically coupled to the second wiring pattern 29 via the fourth bonding member B4, and is electrically coupled to the circuit element 6 via the second wiring pattern 29 and the bonding wire BW. The fourth bonding member B4 is solder, and performs mechanical coupling and electrical coupling between the lead 71 and the substrate 2 by solder reflow. Accordingly, it is possible to easily and accurately couple the lead 71 and the substrate 2. The fourth bonding member B4 is less deteriorated over time and has high reliability. The fourth bonding member B4 is not limited to solder. For example, various brazing materials such as gold brazing filler and silver brazing filler, various metal bumps such as gold bumps and silver bumps, and various conductive adhesives in which a conductive filler is dispersed in a resin-based adhesive can be used.

A free end portion of each lead 71 protrudes to the outside of the mold portion 9, and the lead 71 is attached to the external device at this portion. In the present embodiment, each lead 71 protruding from the mold portion 9 is bent downward in the middle thereof. However, the shape of each lead 71 is not particularly limited, and may be, for example, straight or bent upward. The electronic device 1 is not limited to the QFP, and may be, for example, a plastic leaded chip carrier (PLCC) in which the lead 71 protruding from the mold portion 9 is folded back to the lower side of the substrate 2.

The mold portion 9 molds the acceleration sensor 5 and the circuit element 6, and protects the acceleration sensor 5 and the circuit element 6 from moisture, dust, impact, and the like. The mold portion 9 molds a coupling portion between the substrate 2 and each lead 71, and protects the coupling portion from moisture, dust, impact, and the like. The mold portion 9 bonds the cap 8 and the substrate 2. A mold material constituting the mold portion 9 is not particularly limited. For example, a thermosetting epoxy resin or a curable resin material can be used. The mold portion 9 can be formed by, for example, a transfer molding method.

The mold portion 9 includes a base portion 91 that is located on the lower surface 22 side of the substrate 2 and molds the second electronic component 4, and a fixing portion 92 that is located on the side of the substrate 2, molds a bonding portion between the substrate 2 and the lead 71, and bonds the substrate 2 and the cap 8. The fixing portion 92 has a substantially C-shaped cross section, bypasses the side of the substrate 2 from the lower surface 22 of the substrate 2 and goes around to the upper surface 21 side, and molds the flange portion 82 of the cap 8 to bond the substrate 2 and the cap 8.

According to such a configuration, as described above, it is not necessary to dispose the adhesive between the substrate 2 and the cap 8 when the substrate 2 and the cap 8 are bonded to each other. Therefore, the height of the electronic device 1 can be reduced. There is no risk that the inside of the cap 8 may be contaminated by the outgas generated from the adhesive. Therefore, the electronic device 1 is small and has high reliability. Further, since no adhesive is used, the manufacturing cost of the electronic device 1 can be reduced. In particular, by molding the flange portion 82, the gap between the cap 8 and the substrate 2 can be closed by the mold material, so that the inside of the cap 8 can be hermetically sealed more reliably.

The mold portion 9 molds only from a central portion to an outer peripheral side end portion of the flange portion 82, and a portion on the inner peripheral side of the flange portion 82 is not molded. That is, the flange portion 82 includes a mold region 821 covered with the mold portion 9 and a non-mold region 822 not covered with the mold portion 9. The mold region 821 is provided on the outer peripheral side of the flange portion 82 with respect to the non-mold region 822. By forming the non-mold region 822 in the flange portion 82 in this way, as will be described later, when the mold portion 9 is formed, the cap can be easily supported by the mold, the manufacturing of the electronic device 1 is facilitated, and accuracy thereof is improved.

Next, a method of manufacturing the electronic device 1 will be described. As shown in FIG. 4, the manufacturing step of the electronic device 1 includes a preparation step S1 of preparing the substrate 2 on which the first electronic component 3 and the second electronic component 4 are mounted and to which the leads 71 are bonded, a molding step S2 of forming the mold portion 9 in a state where the substrate 2 is covered with the cap 8, and a lead shaping step S3 of shaping the leads 71.

Preparation Step S1

First, the substrate 2 is prepared in which the first wiring pattern 28 is formed on the upper surface 21, the second wiring pattern 29 is formed on the lower surface 22, and the first wiring pattern 28 and the second wiring pattern 29 are electrically coupled to each other by a through electrode which is not shown. Next, a lead frame 70 shown in FIG. 5 is prepared. The lead frame 70 includes a frame-shaped frame 73, the plurality of leads 71 located inside the frame 73 and supported by the frame 73, and tie bars 74 coupling the plurality of leads 71.

Figure 6:
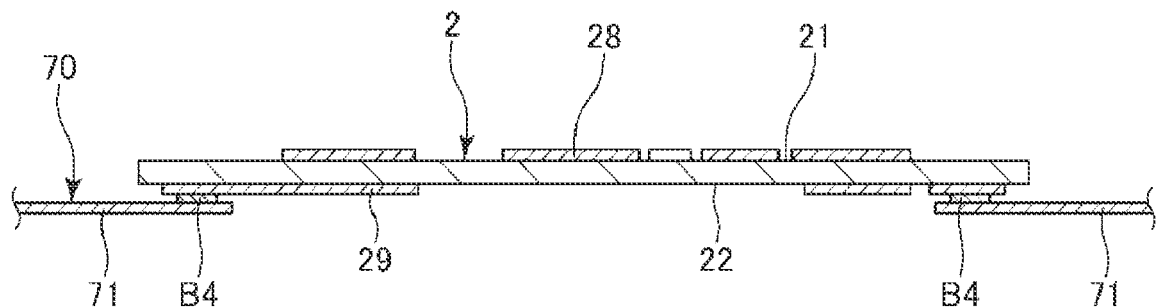
FIG. 6 is a cross-sectional view for illustrating a method of manufacturing the electronic device.

Next, as shown in FIG. 6, the leads 71 are bonded to the lower surface 22 of the substrate 2 via the fourth bonding member B4. Specifically, a cleaning solder paste is used as the fourth bonding member B4. The leads 71 are bonded to the substrate 2 by the solder reflow. A narrow constriction portion is formed on an immediate tip end side of the bonding portion of each lead 71 to the substrate 2. Accordingly, it is possible to prevent wetting and spreading of the fourth bonding member B4 to the tip end side of the lead 71 at the time of the solder reflow.

Next, a flux residue generated by the solder reflow is cleaned and removed. Accordingly, the mold material is easily filled in the portion, so that the mold portion 9 with higher accuracy can be formed. It is also possible to effectively prevent corrosion or the like caused by re-melting of the flux residue at the time of subsequent solder reflow.

Figure 7:
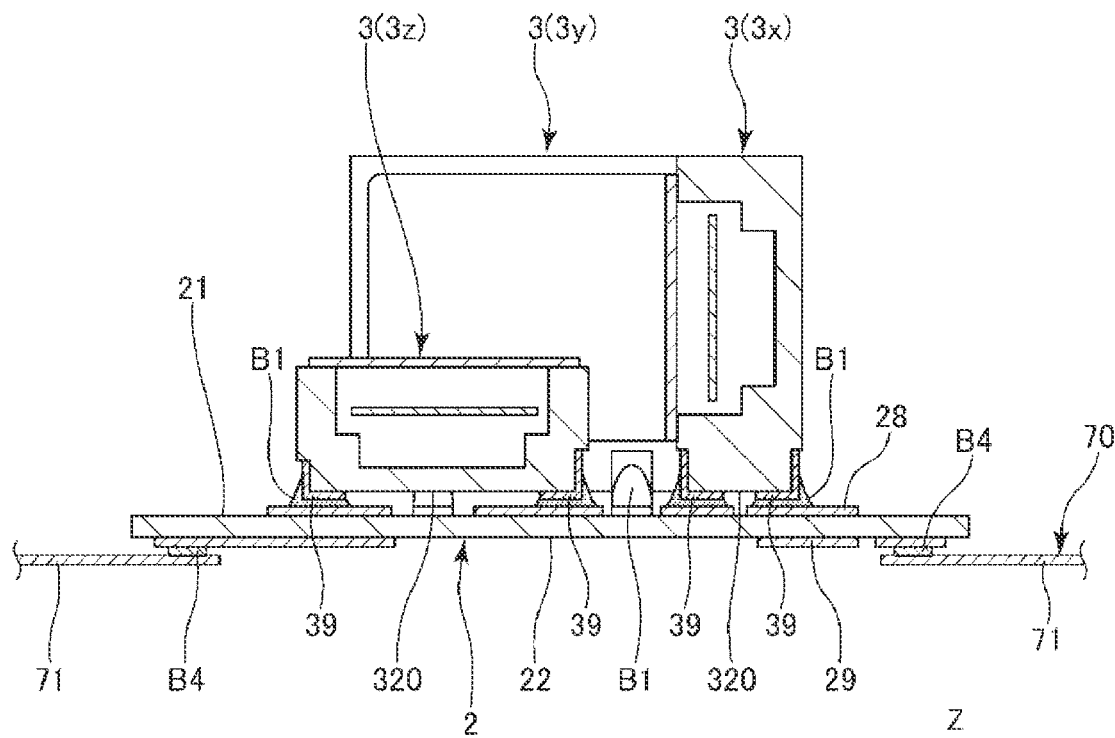
FIG. 7 is a cross-sectional view for illustrating the method of manufacturing the electronic device.

Next, the angular velocity sensors 3x, 3y, and 3z are prepared, and are mounted on the upper surface 21 of the substrate 2 via the first bonding member B1 as shown in FIG. 7. Specifically, a non-cleaning solder paste is used as the first bonding member B1. The angular velocity sensors 3x, 3y, and 3z are bonded to the substrate 2 by the solder reflow. Unlike the case of the lead 71, the flux residue generated by the solder reflow is not cleaned and removed, and a solder mounting surface is kept covered with the flux residue. Accordingly, contact between the portion and the atmosphere can be prevented, and corrosion of the portion can be effectively prevented.

As described above, after the leads 71 are bonded to the substrate 2 by the solder reflow, the angular velocity sensors 3x, 3y, and 3z are bonded to the substrate 2 by the solder reflow, so that thermal damage to the angular velocity sensors 3x, 3y, and 3z can be reduced. Therefore, it is possible to effectively prevent deterioration or fluctuation of the characteristics of each of the angular velocity sensors 3x, 3y, and 3z.

Figure 8:
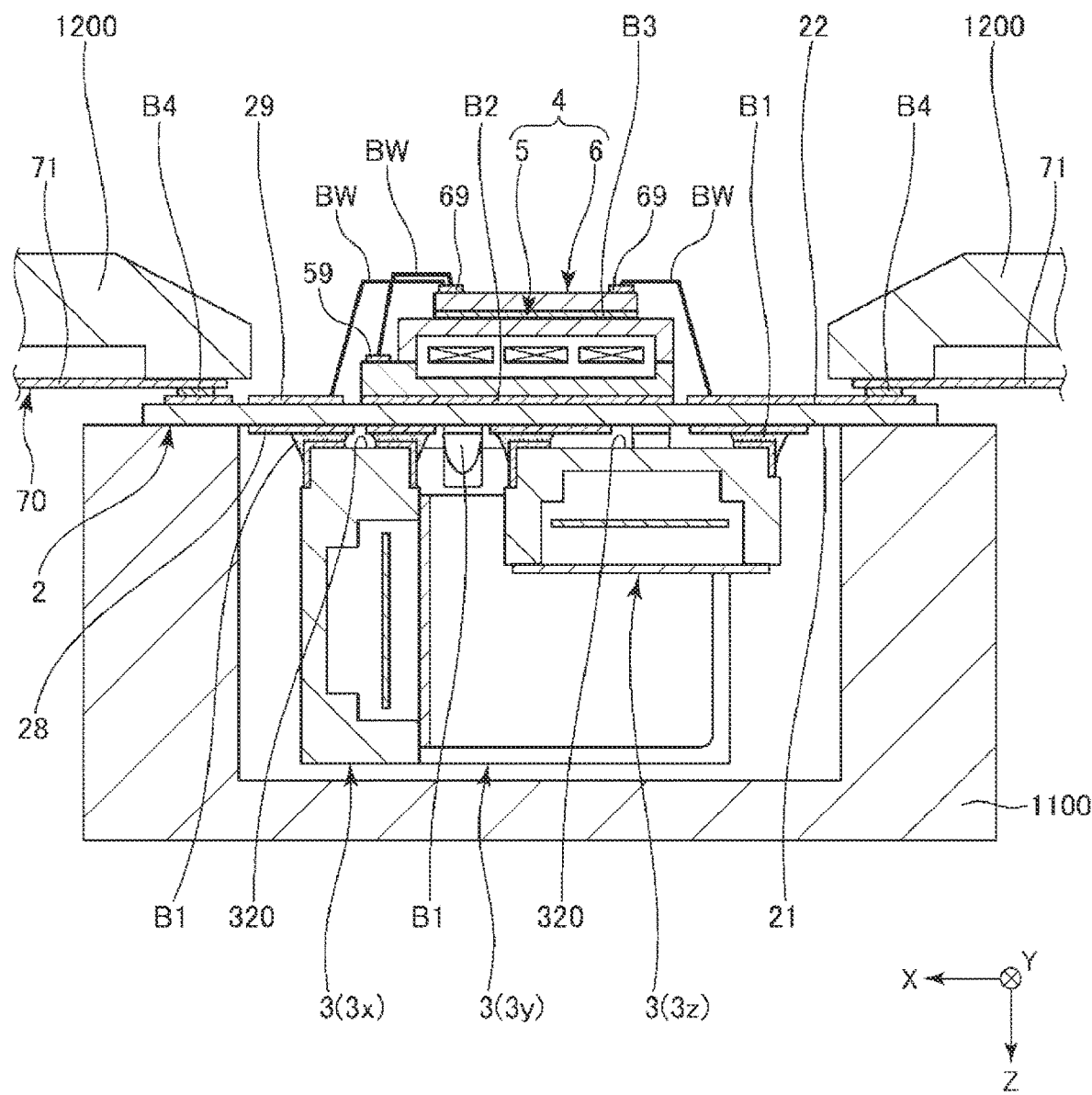
FIG. 8 is a cross-sectional view for illustrating the method of manufacturing the electronic device.

Next, the acceleration sensor 5 and the circuit element 6 are prepared. As shown in FIG. 8, the acceleration sensor 5 is bonded to the lower surface 22 of the substrate 2 via the second bonding member B2. The circuit element 6 is bonded to the lower surface of the acceleration sensor 5 via the third bonding member B3. Accordingly, the mounting of the second electronic component 4 on the lower surface 22 is completed. As the second and third bonding members B2 and B3, the die attach agent, the die attach film, or the like can be used.

After curing of the second and third bonding members B2 and B3 is completed, the bonding wire BW is formed to electrically couple each portion. A wire bonding step can be performed, for example, in a state where the substrate 2 is mounted on a heater block 1100 having a recess for preventing interference with the angular velocity sensors 3x, 3y, and 3z, and the substrate 2 is fixed by a clamper 1200. A heating temperature of the substrate 2 is set to a relatively low temperature, for example, about 180° C. or more and 200° C. or less. Accordingly, thermal damage to the angular velocity sensors 3x, 3y, and 3z, the acceleration sensor 5, and the circuit element 6 can be reduced.

Molding Step S2

Figure 9:
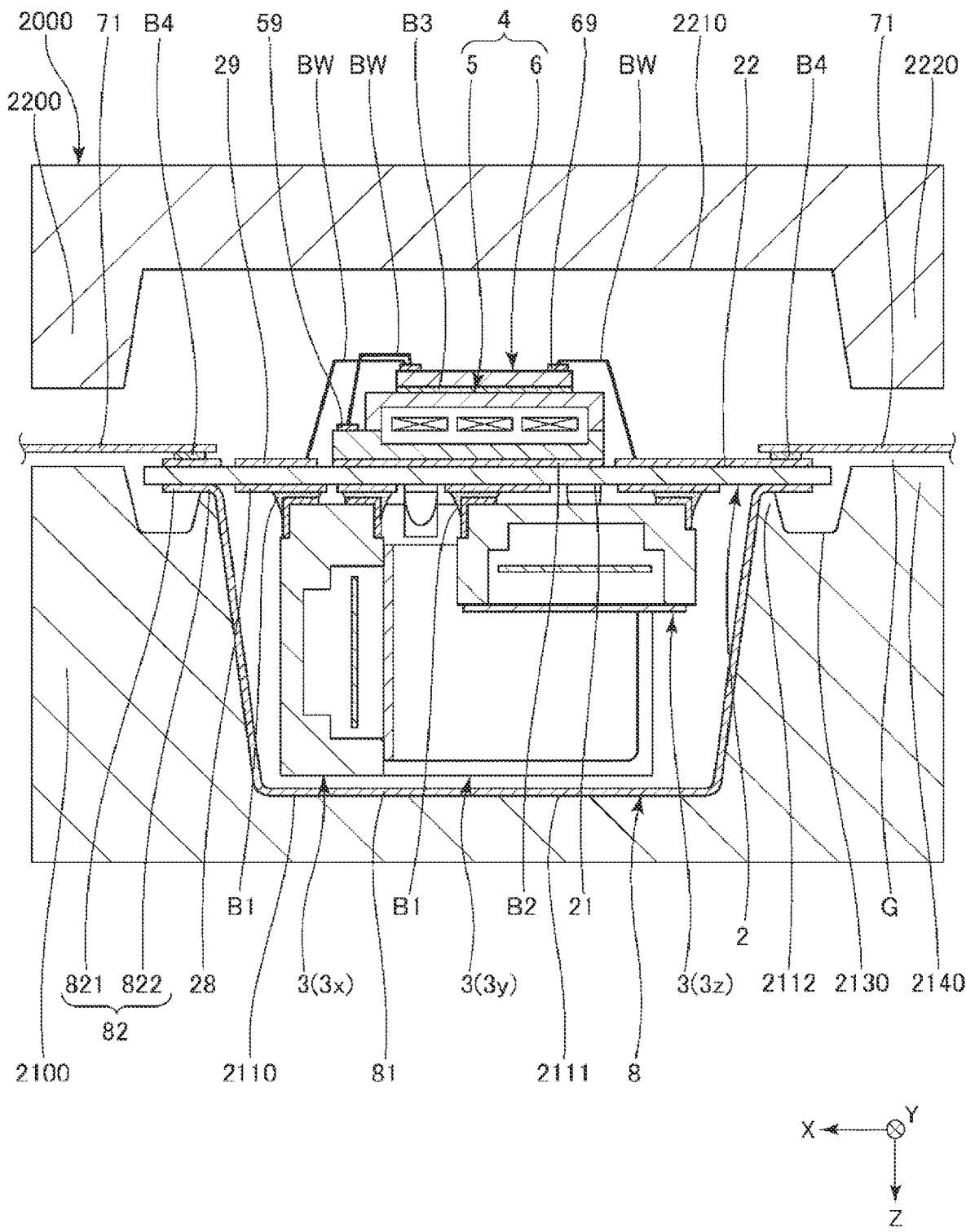
FIG. 9 is a cross-sectional view for illustrating the method of manufacturing the electronic device.

Next, the substrate 2 is molded in a state where the substrate 2 is covered with the cap 8 to form the mold portion 9. In this step, a mold 2000 shown in FIG. 9 is used. The mold 2000 includes a lower mold 2100 as a first mold and an upper mold 2200 as a second mold.

The lower mold 2100 includes a cap mounting portion 2110 on which the cap 8 is mounted, a mold material filling portion 2130 that is located outside the cap mounting portion 2110 and forms a space to be filled with the mold material, and a lead support portion 2140 that is located outside the mold material filling portion 2130 and supports the lead 71.

The cap mounting portion 2110 includes a recess 2111 that opens on an upper surface side of the lower mold 2100 and has a shape conforming to an outer shape of the base portion 81 of the cap 8, and a support portion 2112 that is located outside the recess 2111 and supports the flange portion 82 of the cap 8 from below. In a state in which the cap 8 is mounted in the cap mounting portion 2110, the support portion 2112 comes into contact with the non-mold region 822 of the flange portion 82, that is, a portion from the central portion to the inner peripheral side end portion of the flange portion 82, and supports the portion from below. In this way, by supporting the flange portion 82 located at an outer edge portion of the cap 8, a posture of the cap 8 is stabilized. Further, since the flange portion 82 is also a portion that comes into contact with the substrate 2, a posture of the substrate 2 mounted on the cap 8 is stabilized by supporting the flange portion 82. Therefore, the substrate 2 can be accurately located with respect to the cap 8. What is important here is that the support portion 2112 does not come into contact with the mold region 821 of the flange portion 82, that is, the portion from the central portion to the outer peripheral side end portion of the flange portion 82.

The mold material filling portion 2130 is constituted by a recess recessed from the support portion 2112, and overlaps the mold region 821 of the flange portion 82, that is, the portion from the central portion to the outer peripheral side end portion of the flange portion 82 in the plan view. The mold material filling part 2130 forms a gap for pouring the mold material between the mold region 821 of the flange portion 82 and the lower mold 2100. The lead support portion 2140 is located below the lead 71 and supports the lead 71 by sandwiching the lead 71 between the lead support portion 2140 and the upper mold 2200. In a state in which the substrate 2 is merely mounted on the lower mold 2100, that is, in a state in which the upper mold 2200 is not set, the lead support portion 2140 does not come into contact with the lead 71, and a gap G is formed therebetween.

On the other hand, the upper mold 2200 includes a mold material filling portion 2210 that forms a space for filling the mold material around the second electronic component 4, and a lead pressing portion 2220 that is located outside the mold material filling portion 2210 and presses the lead 71 toward the lead support portion 2140. The mold material filling portion 2210 is constituted by a recess that opens to a lower surface side. In a state in which the upper mold 2200 is set in the lower mold 2100, the second electronic component 4 and a base end portion of each lead 71 are accommodated in the recess. Further, the mold material filling portion 2210 is coupled to the mold material filling portion 2130 at an outer edge portion thereof. One space to be filled with the mold material is formed by the mold material filling portions 2210 and 2130.

In this step, first, the cap 8 is mounted in the cap mounting portion 2110, and then the substrate 2 is mounted on the cap 8. The cap 8 may be mounted in the cap mounting portion 2110 after the substrate 2 is mounted on the cap 8.

Figure 10:
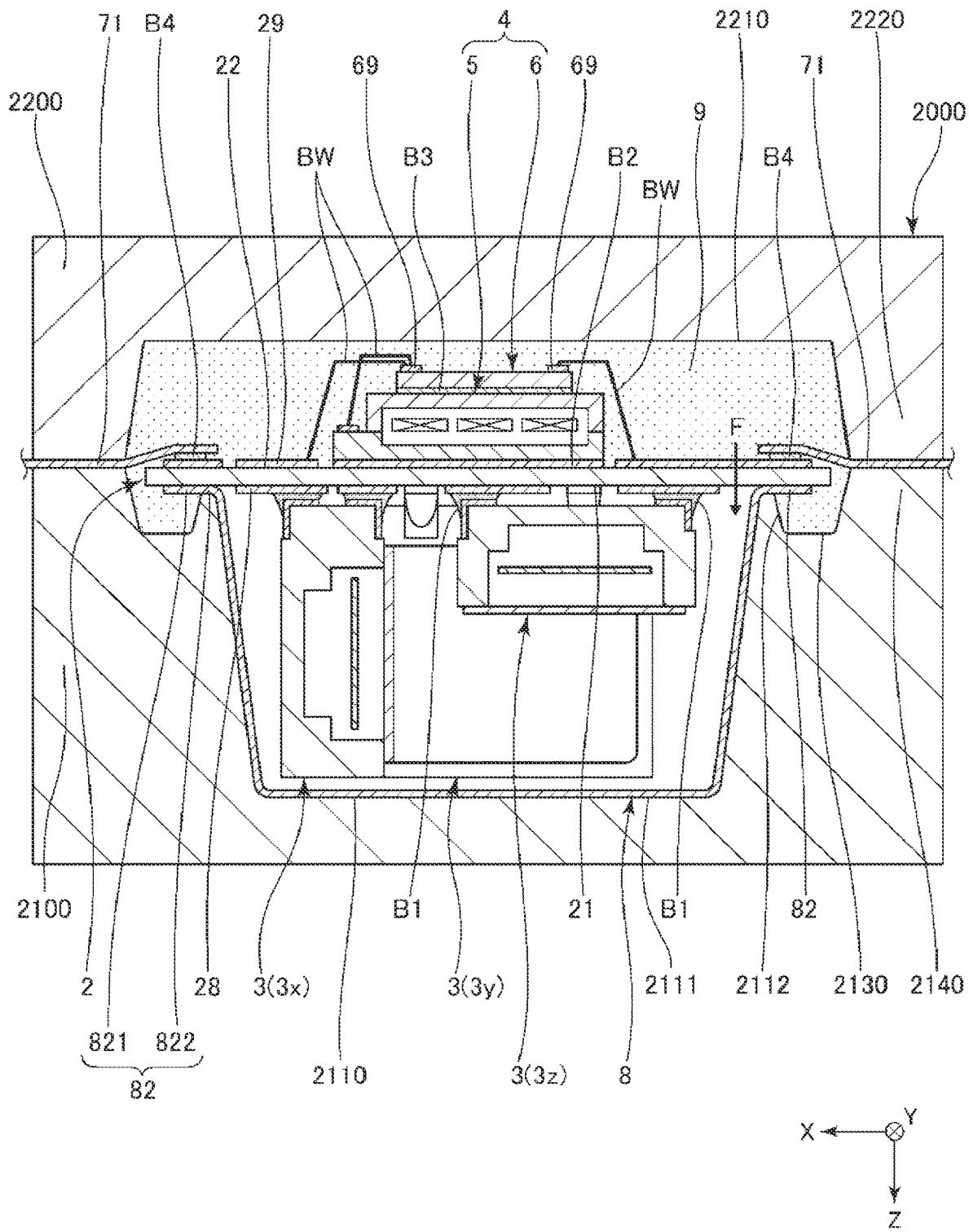
FIG. 10 is a cross-sectional view for illustrating the method of manufacturing the electronic device.

Next, as shown in FIG. 10, the upper mold 2200 is set on the lower mold 2100. In a state where the upper mold 2200 is set on the lower mold 2100, the lead 71 is pressed toward the lead support portion 2140 by the lead pressing portion 2220 and is pressed against the lead support portion 2140. Since the gap G is formed between the lead 71 and the lead support portion 2140, the lead 71 is elastically deformed downward and is sandwiched between the lead support portion 2140 and the lead pressing portion 2220 in this state. Therefore, a restoring force F for returning to a natural state is generated in the lead 71, and the substrate 2 is biased toward the cap 8 by the restoring force F and is pressed against the cap 8. Accordingly, the cap 8 and the substrate 2 are brought into close contact with each other. Therefore, intrusion of the mold material into the cap 8 can be effectively prevented, and the cap 8 can be hermetically sealed more reliably.

In this state, the mold material filling portions 2210 and 2130 are filled with the heated and softened mold material, and the mold portion 9 is formed by cooling and curing the mold material. Accordingly, the mold portion 9 that covers the second electronic component 4 and bonds the cap 8 and the substrate 2 is formed. In particular, since the mold region 821 is located on the outer peripheral side of the flange portion 82 with respect to the non-mold region 822, the bonding of the cap 8 and the substrate 2 and the hermetical sealing of the cap 8 can be easily and more reliably performed.

Lead Shaping Step S3

Next, the frame 73 is removed from the lead frame 70, and the lead 71 is bent into a predetermined shape. Next, the tie bar 74 coupling the leads 71 to each other is cut by a laser, a trim mold, or the like. Accordingly, the electronic device 1 shown in FIG. 1 is manufactured.

According to such a manufacturing method, since the cap 8 and the substrate 2 are bonded to each other using the mold material, the adhesive is not required. Therefore, the height of the electronic device 1 can be reduced as compared with a case where the cap 8 and the substrate 2 are bonded to each other with the adhesive. There is no risk that the inside of the cap 8 may be contaminated by the outgas generated from the adhesive. Therefore, the electronic device 1 is small and has high reliability. Further, since no adhesive is used, the manufacturing cost of the electronic device 1 can be reduced.

The configuration and the manufacturing method of the electronic device 1 are described above. As described above, the method of manufacturing the electronic device 1 is a method of manufacturing the electronic device 1 including the substrate 2 having the upper surface 21 which is the first surface and the lower surface 22 which is the second surface which are in a front and back relationship with each other, the first electronic component 3 mounted on the upper surface 21 of the substrate 2, the lead 71 bonded to the substrate 2, the cap 8 which is disposed on the upper surface 21 and accommodates the first electronic component 3 between the cap 8 and the substrate 2, and the mold portion 9 which molds a bonding portion between the lead 71 and the substrate 2 and bonds the cap 8 and the substrate 2. The method of manufacturing the electronic device 1 includes the preparation step S1 of preparing the substrate 2 on which the first electronic component 3 is mounted and the lead 71 is bonded, and the molding step S2 of mounting the cap 8 in the mold 2000 in a state in which the cap 8 is disposed on the substrate 2 and forming the mold portion 9 by filling the mold material into the mold 2000. The mold 2000 includes the lower mold 2100 as the first mold including the cap mounting portion 2110 in which the cap 8 is mounted, and the upper mold 2200 as the second mold including the lead pressing portion 2220 that presses the lead 71 to elastically deform the lead 71. The molding step S2 includes a step of mounting the cap 8 in the cap mounting portion 2110, a step of mounting the substrate 2 on the cap 8, a step of pressing the lead 71 with the lead pressing portion 2220 to elastically deform the lead 71 and biasing the substrate 2 toward the cap 8 by the restoring force F generated in the lead 71, and a step of filling the mold material into the mold 2000.

According to such a manufacturing method, since the cap 8 and the substrate 2 are bonded to each other using the mold material, the adhesive is not required. Therefore, the height of the electronic device 1 can be reduced as compared with a case where the cap 8 and the substrate 2 are bonded to each other with the adhesive. There is no risk that the inside of the cap 8 may be contaminated by the outgas generated from the adhesive. It is also possible to prevent a decrease in the reliability due to aged deterioration of the adhesive. Therefore, the electronic device 1 is small and has high reliability. Further, since no adhesive is used, the manufacturing cost of the electronic device 1 can be reduced. In particular, by pressing the substrate 2 against the cap 8 by the restoring force F, the cap 8 and the substrate 2 are brought into close contact with each other. Therefore, intrusion of the mold material into the cap 8 can be effectively prevented, and the cap 8 can be hermetically sealed more reliably.

As described above, the mold portion 9 is formed from the lower surface 22 side of the substrate 2 to the upper surface 21 side while bypassing the side. At least a part of the cap 8 is molded in the portion on the upper surface 21 side, thereby bonding the cap 8 and the substrate 2. Accordingly, the cap 8 and the substrate 2 can be bonded to each other with a simple configuration.

As described above, the cap 8 includes the base portion 81 having the recess 811 that opens to the substrate 2 side and accommodates the first electronic component 3, and the flange portion 82 which protrudes from the end portion of the base portion 81 on the substrate 2 side to the outer peripheral side and comes into contact with the upper surface 21. Then, the mold portion 9 bonds the cap 8 and the substrate 2 by molding the flange portion 82 at a portion on the upper surface 21 side. By molding the flange portion 82 in this way, the gap between the cap 8 and the substrate 2 can be closed by the mold material, so that the inside of the cap 8 can be hermetically sealed more reliably.

As described above, the cap mounting portion 2110 supports the flange portion 82. In this way, by supporting the flange portion 82 located at an outer edge portion of the cap 8, a posture of the cap 8 is stabilized. Further, since the flange portion 82 is also a portion that comes into contact with the substrate 2, the posture of the substrate 2 mounted on the cap 8 is also stabilized by supporting the flange portion 82.

As described above, the cap mounting portion 2110 supports the flange portion 82 so as to exclude the outer peripheral side end portion. The mold portion 9 molds the outer peripheral side end portion of the flange portion 82 in the portion on the upper surface 21 side, thereby bonding the cap 8 and the substrate 2. In this way, by supporting the flange portion 82 so as to exclude the outer peripheral side end portion, it is possible to easily form a gap for filling the mold material between the mold 2000 and the outer peripheral side end portion. Therefore, the cap 8 and the substrate 2 can be easily bonded to each other.

As described above, the electronic device 1 includes the second electronic component 4 mounted on the lower surface 22 and molded by the mold portion 9. Accordingly, it is possible to protect the second electronic component 4 from moisture, dust, impact, and the like.

As described above, the angular velocity sensors 3*x*, 3*y*, and 3*z*, which are the first electronic component 3, are packaged surface mount components. Accordingly, the angular velocity sensors 3*x*, 3*y*, and 3*z* are excellent in the mechanical strength and easy to be mounted on the substrate 2. The second electronic component 4 includes the circuit element 6 electrically coupled to the angular velocity sensors 3*x*, 3*y*, and 3*z*. Accordingly, the angular velocity sensors 3*x*, 3*y*, and 3*z* and the circuit element 6 can be coupled in the electronic device 1, and the wiring for coupling the angular velocity sensors 3*x*, 3*y*, and 3*z* and the circuit element 6 can be shortened. Therefore, noise is less likely to be added to the detection signals output from the angular velocity sensors 3*x*, 3*y*, and 3*z*, and the angular velocity around each axis can be accurately detected.

As described above, the circuit element 6 is a bare chip. Accordingly, it is possible to reduce the size and the cost of the circuit element 6.

As described above, the angular velocity sensors 3*x*, 3*y*, and 3*z* are physical quantity sensors each including the package 31 and the physical quantity detection element 34 accommodated in the package 31. The circuit element 6 includes the interface circuit 62 that communicates with the outside. Accordingly, the electronic device 1 can be mounted on various electronic components and has high convenience and demand.

As described above, the first electronic component 3, which is the physical quantity sensor, is the angular velocity sensors 3x, 3y, and 3z. The second electronic component 4 includes the acceleration sensor 5 in addition to the circuit element 6. The acceleration sensor 5 is bonded to the lower surface 22. The circuit element 6 is bonded to the acceleration sensor 5. The circuit element 6 is electrically coupled to the angular velocity sensors 3x, 3y, and 3z and the acceleration sensor 5. Accordingly, the electronic device 1 can be used as a composite sensor capable of independently detecting the angular velocity and the acceleration. Therefore, the electronic device 1 can be mounted on various electronic components and has high convenience and demand. Since the shape of the acceleration sensor 5 in the plan view is larger than the shape of the circuit element 6 in the plan view, the acceleration sensor 5 and the circuit element 6 can be disposed in a well-balanced manner by bonding the acceleration sensor 5 to the lower surface 22 and bonding the circuit element 6 to the acceleration sensor 5.

As described above, the substrate 2 is a ceramic substrate. Accordingly, the substrate 2 having high corrosion resistance is obtained. The substrate 2 having excellent mechanical strength is obtained. Therefore, the electronic device 1 having excellent long-term reliability is obtained.

Second Embodiment

Figure 11:
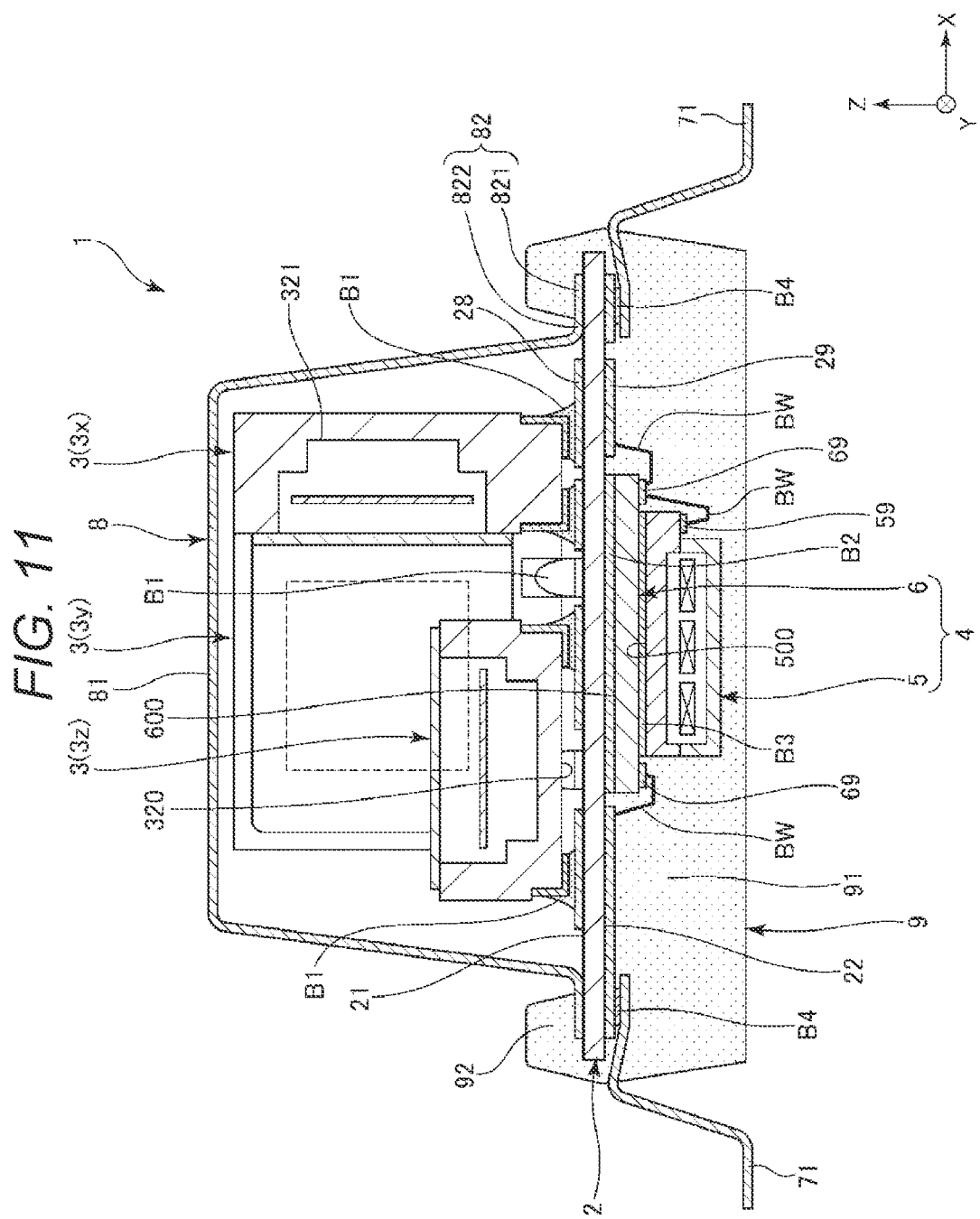
FIG. 11 is a cross-sectional view showing an electronic device according to a second embodiment.

FIG. 11 is a cross-sectional view showing an electronic device according to a second embodiment.

The present embodiment is the same as the first embodiment described above except that the arrangement of the acceleration sensor 5 and the circuit element 6 is different. In the following description, the present embodiment will be described with a focus on the difference from the above embodiment, and a description of similar matters will be omitted. In FIG. 11, the same reference numerals are given to configurations similar to those according to the above embodiment.

As shown in FIG. 11, in the electronic device 1 according to the present embodiment, the circuit element 6 is bonded to the lower surface 22 via the second bonding member B2 on an upper surface 600 thereof. The acceleration sensor 5 is bonded to a lower surface of the circuit element 6 via the third bonding member B3 on an upper surface 500 thereof. In the present embodiment, since a shape of the circuit element 6 in a plan view is larger than a shape of the acceleration sensor 5 in the plan view, the circuit element 6 is bonded to the substrate 2, and the acceleration sensor 5 is bonded to the circuit element 6. Accordingly, the acceleration sensor 5 and the circuit element 6 can be disposed on the substrate 2 in a well-balanced manner.

As described above, in the electronic device 1 according to the present embodiment, the first electronic component 3, which is a physical quantity sensor, is the angular velocity sensors 3x, 3y, and 3z. The second electronic component 4 includes the acceleration sensor 5 in addition to the circuit element 6. The circuit element 6 is bonded to the lower surface 22. The acceleration sensor 5 is bonded to the circuit element 6. The circuit element 6 is electrically coupled to the angular velocity sensors 3x, 3y, and 3z and the acceleration sensor 5. Accordingly, the electronic device 1 can be used as a composite sensor capable of independently detecting the angular velocity and the acceleration. Therefore, the electronic device 1 can be mounted on various electronic components and has high convenience and demand. Since the shape of the circuit element 6 in the plan view is larger than the shape of the acceleration sensor 5 in the plan view, the circuit element 6 and the acceleration sensor 5 can be disposed in the well-balanced manner by bonding the circuit element 6 to the lower surface 22 and bonding the acceleration sensor 5 to the circuit element 6.

Even with such a second embodiment, the same effects as those of the first embodiment can be exerted.

Third Embodiment

FIG. 12 is a cross-sectional view showing an electronic device according to a third embodiment.

The present embodiment is the same as the second embodiment described above except that the second electronic component 4 is electrically coupled to the second wiring pattern 29 via the second bonding member B2 instead of the bonding wire BW. In the following description, the present embodiment will be described with a focus on the difference from the above embodiments, and a description of similar matters will be omitted. In FIG. 12, the same reference numerals are given to configurations similar to those according to the above embodiments.

As shown in FIG. 12, in the circuit element 6 according to the present embodiment, a plurality of second mounting terminals 69 are disposed not only on the lower surface but also on the upper surface 600. The circuit element 6 is bonded to the lower surface 22 of the substrate 2 via the conductive second bonding member B2 on the upper surface 600. The second mounting terminal 69 is electrically coupled to the second wiring pattern 29 via the second bonding member B2. The second bonding member B2 is various metal bumps such as gold bumps and silver bumps. Accordingly, it is possible to easily and accurately couple the circuit element 6 and the substrate 2.

The second bonding member B2 has a melting point higher than that of the solder as the first bonding member B1. More specifically, the second bonding member B2 has such a melting point that the second bonding member B2 is not melted by heat applied during a manufacturing step of the electronic device 1 or during solder reflow when the electronic device 1 is solder-mounted. The melting point of the second bonding member B2 is not particularly limited, and is preferably higher than the melting point of the solder as the first bonding member B1 by 50° C. or more, and more preferably by 100° C. or more. Accordingly, it is possible to effectively prevent melting of the second bonding member B2 at the time of the solder reflow.

According to the third embodiment, the same effects as those of the first embodiment described above can be achieved.

As mentioned above, although the method of manufacturing the electronic device according to the present disclosure is described based on illustrated embodiments, the present disclosure is not limited thereto. A configuration of each part can be replaced with any configuration having a similar function. Further, any other constituents may be added to the present disclosure. The embodiments may be combined as appropriate.

In the above embodiments, only a part of the flange portion 82 of the cap 8 is molded by the mold portion 9, whereas the present disclosure is not limited thereto. For example, the entire region of the flange portion 82 may be molded by the mold portion 9, or the entire region of the cap 8 may be molded by the mold portion 9.

What is claimed is:
1. A method of manufacturing an electronic device, the electronic device including:
a substrate having a first surface and a second surface that are in a front and back relationship with each other;

a first electronic component mounted on the first surface of the substrate;

a lead bonded to the substrate;

a cap disposed on the first surface and accommodating the first electronic component between the cap and the substrate; and a mold portion molding a bonding portion between the lead and the substrate and bonding the cap and the substrate, the method of manufacturing the electronic device comprising:

a preparation step of preparing the substrate on which the first electronic component is mounted and to which the lead is bonded; and a molding step of mounting the cap in a mold in a state in which the cap is disposed on the substrate, and forming the mold portion by filling a mold material into the mold, wherein the mold includes
- a first mold including a cap mounting portion in which the cap is mounted, and
- a second mold including a lead pressing portion configured to press the lead to elastically deform the lead, and the molding step includes
- mounting the cap in the cap mounting portion,
- mounting the substrate on the cap,
- pressing the lead by the lead pressing portion to elastically deform the lead, and biasing the substrate toward the cap side by a restoring force generated in the lead, and
- filling the mold material into the mold.

2. The method of manufacturing the electronic device according to claim 1, wherein
the mold portion is formed from a second surface side of the substrate to a first surface side while bypassing a side, and the cap and the substrate are bonded to each other by molding at least a part of the cap in a portion on the first surface side.

3. The method of manufacturing the electronic device according to claim 2, wherein
the cap includes a base portion having a recess that opens to a substrate side and accommodates the first electronic component, and a flange portion that protrudes from an end portion of the base portion on the substrate side to an outer peripheral side and comes into contact with the first surface, and
the mold portion bonds the cap and the substrate to each other by molding the flange portion in the portion on the first surface side.

4. The method of manufacturing the electronic device according to claim 3, wherein
the cap mounting portion supports the flange portion.

5. The method of manufacturing the electronic device according to claim 4, wherein
the cap mounting portion supports the flange portion so as to exclude an outer peripheral side end portion, and
the mold portion bonds the cap and the substrate to each other by molding the outer peripheral side end portion of the flange portion in the portion on the first surface side.

6. The method of manufacturing the electronic device according to claim 1, wherein
the electronic device includes a second electronic component mounted on the second surface and molded by the mold portion.

7. The method of manufacturing the electronic device according to claim 6, wherein
the first electronic component is a packaged surface mount component, and
the second electronic component includes a circuit element electrically coupled to the surface mount component.

8. The method of manufacturing the electronic device according to claim 7, wherein
the circuit element is a bare chip.

9. The method of manufacturing the electronic device according to claim 7, wherein
the surface mount component is a physical quantity sensor including a package and a physical quantity detection element accommodated in the package, and
the circuit element includes an interface circuit that communicates with the outside.

10. The method of manufacturing the electronic device according to claim 9, wherein
the physical quantity sensor is an angular velocity sensor,
the second electronic component includes an acceleration sensor in addition to the circuit element,
the acceleration sensor is bonded to the second surface, and the circuit element is bonded to the acceleration sensor, and
the circuit element is electrically coupled to the angular velocity sensor and the acceleration sensor.

11. The method of manufacturing the electronic device according to claim 9, wherein
the physical quantity sensor is an angular velocity sensor,
the second electronic component includes an acceleration sensor in addition to the circuit element,
the circuit element is bonded to the second surface, and the acceleration sensor is bonded to the circuit element, and
the circuit element is electrically coupled to the angular velocity sensor and the acceleration sensor.

12. The method of manufacturing the electronic device according to claim 1, wherein
the substrate is a ceramic substrate.

* * * * *